(12) United States Patent
Xia et al.

(10) Patent No.: US 11,056,577 B2
(45) Date of Patent: Jul. 6, 2021

(54) THIN-FILM TRANSISTOR AND MANUFACTURING METHOD FOR THE SAME

(71) Applicant: SHENZHEN CHINA STAR OPTOELECTRONICS SEMICONDUCTOR DISPLAY TECHNOLOGY CO., LTD., Guangdong (CN)

(72) Inventors: Hui Xia, Guangdong (CN); Zhiwei Tan, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 443 days.

(21) Appl. No.: 16/080,596

(22) PCT Filed: Aug. 1, 2018

(86) PCT No.: PCT/CN2018/098004
§ 371 (c)(1),
(2) Date: Aug. 28, 2018

(87) PCT Pub. No.: WO2020/015016
PCT Pub. Date: Jan. 23, 2020

(65) Prior Publication Data
US 2021/0098607 A1 Apr. 1, 2021

(30) Foreign Application Priority Data

Jul. 20, 2018 (CN) .......................... 201810805694.4

(51) Int. Cl.
*H01L 29/00* (2006.01)
*H01L 29/66* (2006.01)
(Continued)

(52) U.S. Cl.
CPC .. *H01L 29/66742* (2013.01); *H01L 29/41733* (2013.01); *H01L 29/786* (2013.01)

(58) Field of Classification Search
CPC ......... H01L 29/66742; H01L 29/41733; H01L 29/786
See application file for complete search history.

(56) References Cited

U.S. PATENT DOCUMENTS

| 9,893,092 B2 * | 2/2018 | Park .................... H01L 27/1225 |
| 2006/0175609 A1 | 8/2006 | Chan et al. |
| 2016/0300852 A1 * | 10/2016 | Park ...................... H01L 27/127 |

FOREIGN PATENT DOCUMENTS

| CN | 103022148 A | 4/2013 |
| CN | 105655403 A | 6/2016 |

* cited by examiner

*Primary Examiner* — Nikolay K Yushin
(74) *Attorney, Agent, or Firm* — Leong C. Lei

(57) ABSTRACT

A thin-film transistor and a manufacturing method for the same are disclosed. The method includes steps of: depositing a first metal layer on a substrate; depositing a semiconductor material layer on the first metal layer, and using a first photolithography process to perform a patterning process to the semiconductor material layer in order to form a semiconductor active layer depositing a second metal layer on the first metal layer and the semiconductor active layer, and using a second photolithography process to perform a patterning process to the first metal layer and the second metal layer in order to obtain a first electrode, a second electrode, and a third electrode, wherein the first electrode and the second electrode are disposed at an interval, the first electrode is disposed on the substrate, the second electrode is disposed between the substrate and the semiconductor active layer, and the third electrode is disposed on the semiconductor active layer, projections of the second electrode and the third electrode on a horizontal plane are overlapped; the (Continued)

first electrode is formed by the first metal layer and the second metal layer. The fabrication of the first electrode, the second electrode, the third electrode, and the active layer can be completed by only two photolithography processes, which reduce process steps and reduce cost.

12 Claims, 4 Drawing Sheets

(51) Int. Cl.
*H01L 29/786* (2006.01)
*H01L 29/417* (2006.01)

THIN-FILM TRANSISTOR AND MANUFACTURING METHOD FOR THE SAME

RELATED APPLICATIONS

The present application is a National Phase of International Application Number PCT/CN2018/098004, filed Aug. 1, 2018, and claims the priority of China Application No. 201810805694.4, filed Jul. 20, 2018.

FIELD OF THE INVENTION

The present invention relates to a display technology field, and more particularly to thin-film transistor and manufacturing method for the same.

BACKGROUND OF THE INVENTION

With the development of display technology, the flat panel display device such as the liquid crystal display (LCD) is widely used in mobile phone, television, personal digital assistant, digital camera, notebook computer, desktop computer and other consumer electronic product etc. due to high image quality, power saving, thin body and wide application range, and the LCD has become the mainstream in display devices.

In the liquid crystal display, the display panel is used to control the operation state of the liquid crystal layer, and the fabrication of the thin-film transistor is a very critical step in the manufacturing process of the display panel. In the fabrication process, a conventional thin-film transistor requires at least three photolithography processes to connect the lift-off process to form a source electrode, a drain electrode, a gate electrode, and an active layer. The overall process is complicated and the fabrication cost is high.

SUMMARY OF THE INVENTION

In order to solve the above-mentioned deficiencies of the prior art, an object of the present invention to provide a thin-film transistor formed by two photolithography processes, a manufacturing method for the same, and a display panel having the same.

In order to achieve the above object, the present invention adopts the following technical solutions: a manufacturing method for thin-film transistor, comprising steps of: step 1: depositing a first metal layer on a substrate; step 2: depositing a semiconductor material layer on the first metal layer, and using a first photolithography process to perform a patterning process to the semiconductor material layer in order to form a semiconductor active layer; step 3: depositing a second metal layer on the first metal layer and the semiconductor active layer, and using a second photolithography process to perform a patterning process to the first metal layer and the second metal layer in order to obtain a first electrode, a second electrode, and a third electrode, wherein the first electrode and the second electrode are disposed at an interval, the first electrode is disposed on the substrate, the second electrode is disposed between the substrate and the semiconductor active layer, and the third electrode is disposed on the semiconductor active layer, projections of the second electrode and the third electrode on a horizontal plane are overlapped; the first electrode is formed by the first metal layer and the second metal layer.

Optionally, after the step 3, the method further comprises a step of: forming an insulation layer on the first electrode, the third electrode and the substrate.

Optionally, the first electrode is formed by the first metal layer and the second metal layer.

Optionally, a thickness of the third electrode is greater than a thickness of the semiconductor active layer.

Optionally, a difference between the thickness of the third electrode and the thickness of the active layer is greater than or equal to 500 Å.

Optionally, the step of depositing a semiconductor material layer on the first metal layer, and using a first photolithography process to perform a patterning process to the semiconductor material layer in order to form a semiconductor active layer comprises steps of: depositing the semiconductor material layer on the first metal layer; depositing a first photoresist layer on the semiconductor material layer; using a first mask to expose the first photoresist layer, and then developing to obtain a first photoresist block; etching the semiconductor material layer not covered by the first photoresist block to obtain the semiconductor active layer; and stripping the first photoresist block.

Optionally, the step of depositing a second metal layer on the first metal layer and the semiconductor active layer, and using a second photolithography process to perform a patterning process to the first metal layer and the second metal layer in order to obtain a first electrode, a second electrode, and a third electrode comprises steps of: depositing a second metal layer on the first metal layer and the active layer; depositing a second photoresist material layer on the second metal layer; using a second mask to expose the second photoresist material layer, and then developing to obtain a second photoresist block and a third photoresist block which are disposed at an interval; etching the first metal layer and the second metal layer to obtain the first electrode, the second electrode, and the third electrode; and stripping the second photoresist block and the third photoresist block.

Optionally, the first electrode is a gate electrode, the second electrode and the third electrode are source electrode and drain electrode.

The present invention also provides a thin-film transistor manufactured by the manufacturing method as described above, wherein thin-film transistor comprises: a first electrode and a second electrode disposed on the substrate; a semiconductor active layer disposed on the second electrode; a third electrode disposed on the semiconductor active layer, and an insulation layer covering the first electrode, the second electrode, the semiconductor active layer, and the third electrode; wherein the first electrode and the second electrode are disposed at an interval, the first electrode is formed by a first metal layer and a second metal layer, the second electrode is formed by the first metal layer, the third electrode is formed by the second metal layer, and projections of the second electrode and the third electrode on a horizontal plane are overlapped.

Optionally, a thickness of the third electrode is greater than a thickness of the semiconductor active layer.

Beneficial effect: the thin-film transistor and the manufacturing method for the same disclosed by the present invention can complete the fabrication of the first electrode, the second electrode, the third electrode and the active layer by only two photolithography processes, thereby reducing process steps and reducing cost.

DETAILED DESCRIPTION OF PREFERRED EMBODIMENTS

The present invention will be further described in detail below with reference to the accompanying drawings and embodiments. It is understood that the specific embodiments described herein are merely illustrative of the invention and are not intended to limit the invention.

First Embodiment

Figure 1:
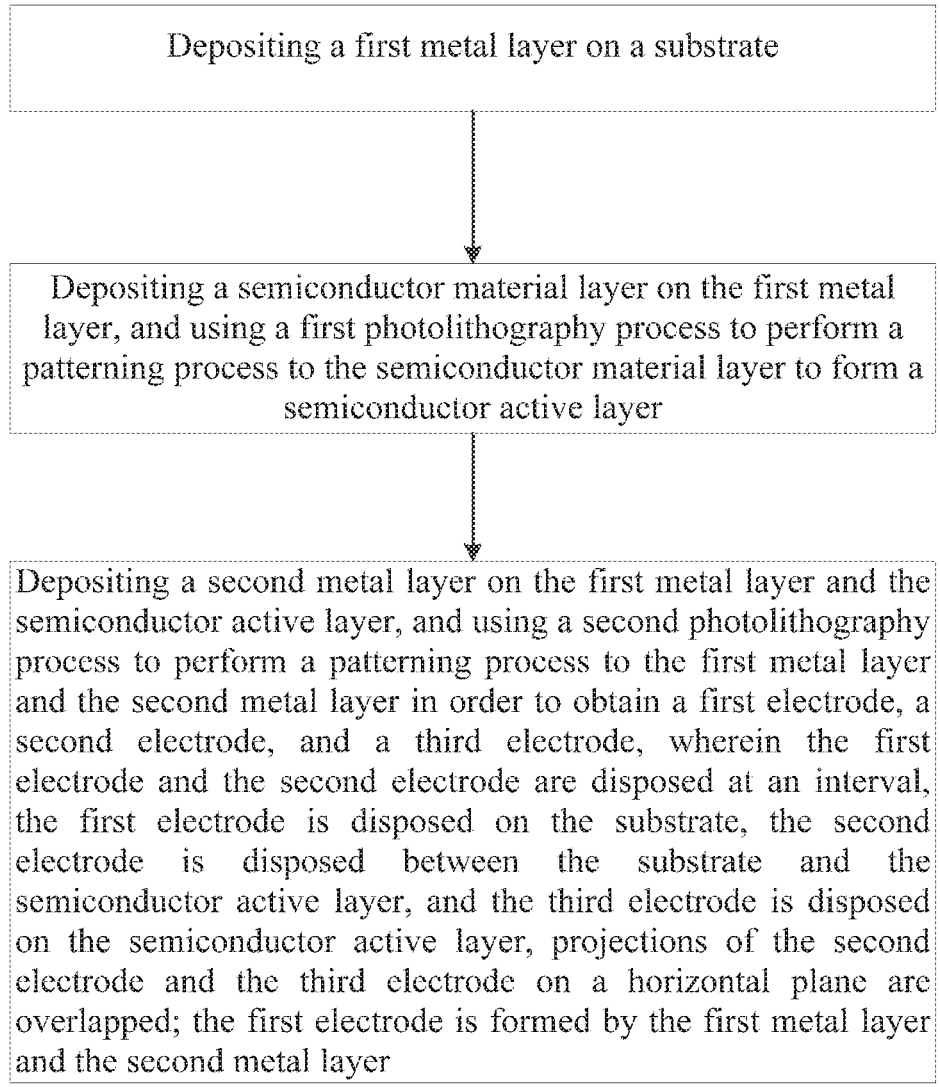
FIG. 1 is a flow chart of a manufacturing method for thin-film transistor according to a first embodiment of the present invention.
Figure 2A:
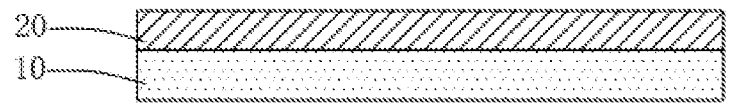
FIG. 2A to FIG. 2N are process diagrams of the thin-film transistor of the first embodiment of the present invention.

FIG. 1 shows a flow chart of a manufacturing method for thin-film transistor according to an embodiment of the present invention, the manufacturing method includes a step 1 to a step 4:

Specifically, in the step 1: referring to FIG. 2A, depositing a first metal layer 20 on a substrate 10.

As a preferred embodiment, the substrate 10 is a glass substrate, and the first metal layer 20 is deposited on the substrate 10 by a physical vapor deposition (referred as PVD) process. The first metal layer 20 covers an entire surface of the substrate 10. A material of the first metal layer 20 may be a molybdenum copper alloy or a molybdenum aluminum alloy.

Step 2: referring to FIG. 2B to FIG. 2E, depositing a semiconductor material layer 30 on the first metal layer 20, and using a first photolithography process to perform a patterning process to the semiconductor material layer 30 in order to form a semiconductor active layer 30a.

Figure 2B:
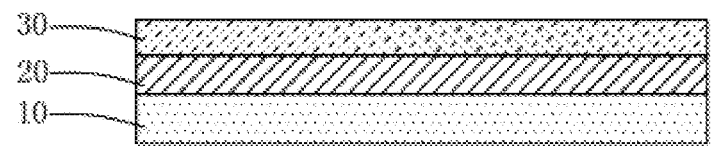

As a preferred embodiment, the step 2 includes a step 21 to a step 25:

Step 21: referring to FIG. 2B, forming a semiconductor material layer 30 on the first metal layer 20. As a preferred embodiment, the semiconductor material layer 30 is deposited on the first metal layer 20 by a physical vapor deposition process. The semiconductor material layer 30 covers the entire surface of the first metal layer 20. The material of the semiconductor material layer 30 is preferably indium gallium zinc oxide.

Figure 2C:
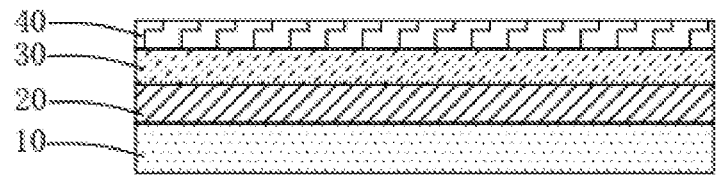

Step 22: referring to FIG. 2C, depositing a first photoresist layer 40 on the semiconductor material layer 30.

Figure 2D:
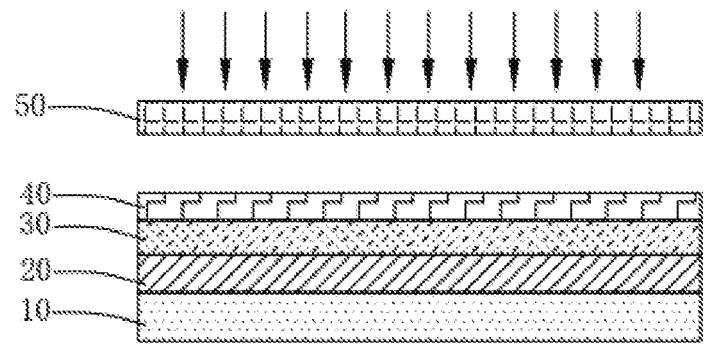
Figure 2E:
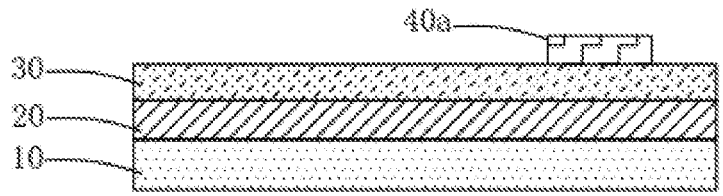

Step 23: referring to FIG. 2D and FIG. 2E, using a first mask 50 to expose the first photoresist layer 40, and then developing to obtain a first photoresist block 40a. Specifically, developing the exposed first photoresist material layer 40 to form the first photoresist block 40a opposite to the active layer 30a. Wherein the first mask 50 is a halftone mask having a predetermined pattern. In this embodiment, the halftone mask includes a non-transparent region, a semi-transparent region and a fully transparent region.

Furthermore, controlling the exposure energy such that a portion of the first photoresist layer 40 located under the semi-transparent region and the fully transparent region is sufficiently exposed such that after the first photoresist material layer 40 is developed, the first photoresist material layer 40 corresponding to the semi-transparent region and the fully transparent region is completely etched away, and only the portion corresponding to the non-transparent region is retained, thereby forming the first photoresist block 40a, wherein the first photoresist block 40a has a thickness of 5000 Å to 1000 Å.

Figure 2F:
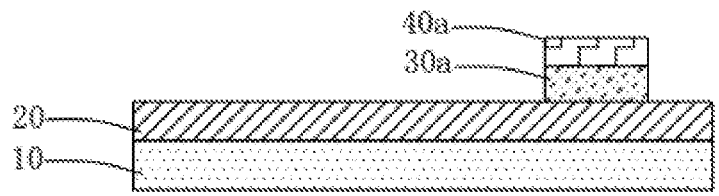

Step 24: referring to FIG. 2F, etching the semiconductor material layer 30 not covered by the first photoresist block 40a to obtain the semiconductor active layer 30a.

As a preferred embodiment, using a plasma gas to perform a dry etching to the semiconductor material layer 30 not covered by the first photoresist block 40a in order to form the active layer 30a. Of course, in other embodiments, the semiconductor material layer 30 not covered by the first photoresist block 40a may be wet etched by using an etchant.

Figure 2G:
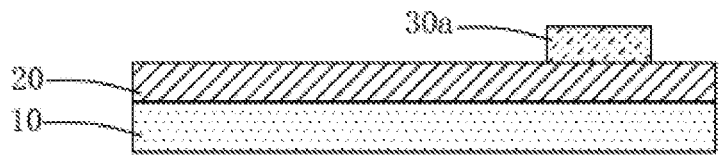

Step 25: referring to FIG. 2G, stripping the first photoresist block 40a.

Step 3: referring to FIG. 2H to FIG. 2M, depositing a second metal layer 60 on the first metal layer 20 and the semiconductor active layer 30a, and using a second photolithography process to perform a patterning process to the first metal layer 20 and the second metal layer 60 in order to obtain a first electrode 61, a second electrode 63, and a third electrode 62. The first electrode 61 and the second electrode 63 are disposed at an interval, the first electrode 61 is disposed on the substrate 10, the second electrode 63 is disposed between the substrate 10 and the semiconductor active layer 30a, and the third electrode 62 is disposed on the semiconductor active layer 30a, projections of the second electrode 63 and the third electrode 62 on a horizontal plane are overlapped.

Figure 2H:
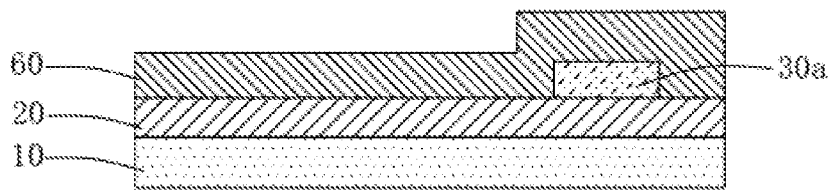

As a preferred embodiment, the step 3 includes a step 31 to a step 35:

The step 31: referring to FIG. 2H, depositing a second metal layer 60 on the first metal layer 20 and the active layer 30a.

As a preferred embodiment, the second metal layer 60 is formed on the substrate 10 by a physical vapor deposition process. The second metal layer 60 entirely covers the first metal layer 20 and the active layer 30a. A material of the second metal layer 60 may be molybdenum copper alloy or molybdenum aluminum alloy.

Figure 2I:
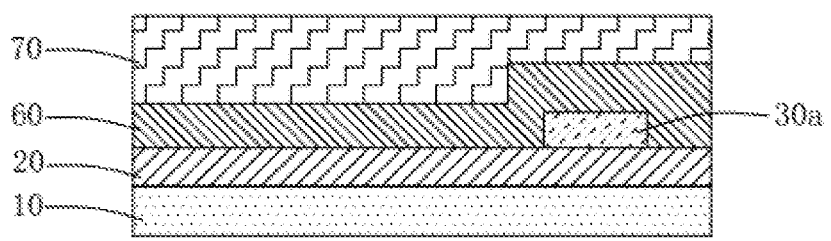

Step 32: referring to FIG. 2I, forming a second photoresist material layer 70 on the second metal layer 60.

Figure 2J:
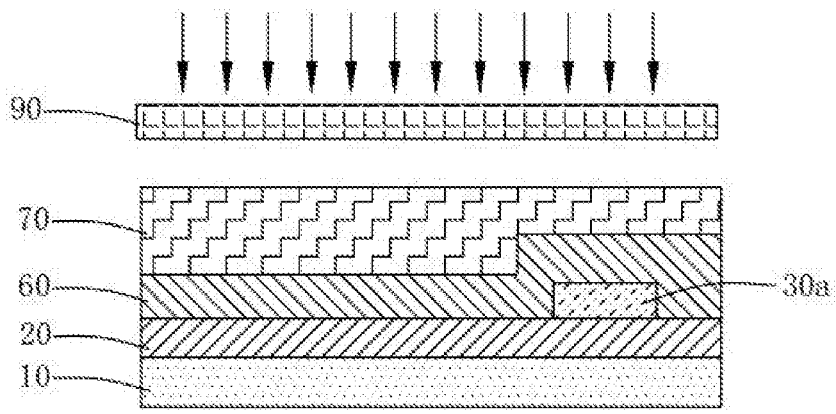
Figure 2K:
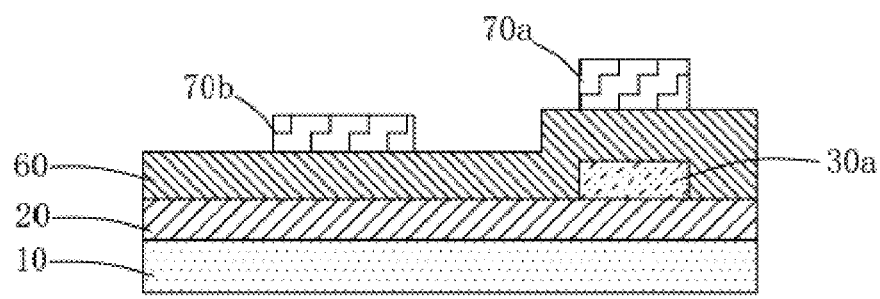

Step 33: referring to FIG. 2J and FIG. 2K, using a second mask 90 to expose the second photoresist material layer 70, and then developing to obtain a second photoresist block 70a and a third photoresist block 70b which are disposed at an interval. Wherein the second photoresist block 70a is opposite to the active layer 30a, and the third photoresist block 70b is opposite to the first electrode 61 to be formed.

Furthermore: the second mask 90 is a halftone mask having a predetermined pattern. In the present embodiment, the halftone mask includes a non-transparent region, a semi-transparent region and a fully transparent region. Furthermore, controlling the exposure energy such that a portion of the second photoresist material layer 70 located under the fully transparent region is sufficiently exposed and a portion of the second photoresist material layer 70 located under the semi-transparent region is partially exposed such that after the second photoresist material layer 70 is developed, the second photoresist material layer 40 corresponding to the fully transparent region is completely etched away, and the portion corresponding to the non-transparent region and the semi-transparent region is retained, thereby forming the second photoresist block 70a and the third photoresist block 70b, wherein the second photoresist block 70a has a thickness of 10000 Å~20000 Å, and the third photoresist block 70b has a thickness of 3000 Å~6000 Å

As a preferred embodiment, the second mask 90 and the first mask 50 use the same halftone mask, and by controlling the exposure intensity, different patterns are generated by using the same halftone mask, so that when the second photolithography process is performed, no new mask is required and the same mask is used to reduce the production cost.

Figure 2L:
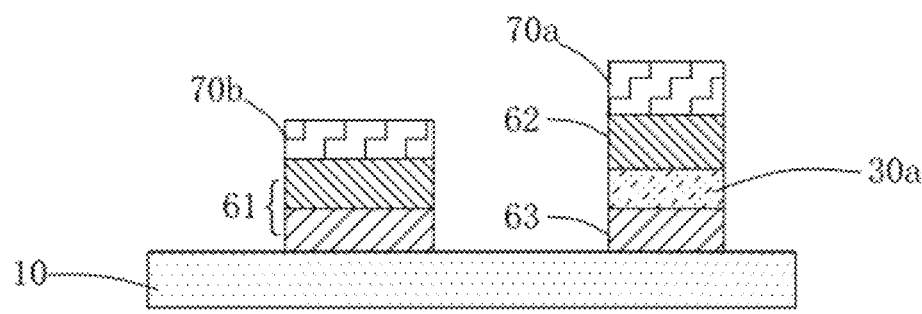

Step 34: referring to FIG. 2L, etching the first metal layer 20 and the second metal layer 60 to obtain the first electrode 61, the second electrode 63, and the third electrode 62. The first electrode 61 is formed by the first metal layer and the second metal layer.

Specifically, a portion of the first metal layer 20 and a portion of the second metal layer 60 which are not covered by the second and third photoresist blocks 70a and 70b are etched away.

Figure 2M:
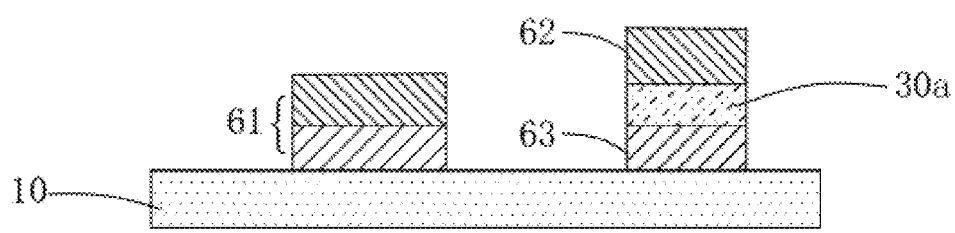

Step 35: referring to FIG. 2M, stripping the second photoresist block 70a and the third photoresist block 70b to form a first electrode 61, a second electrode 63, and a third electrode 62.

Wherein the first electrode 61 serves as a gate electrode, and the first metal layer 20 and the second metal layer 60 located on the upper and lower surfaces of the active layer 30a respectively form the second electrode 63 and the third electrode 62 function as source electrode and drain electrode. Or, the second electrode 63 and the third electrode 62 respectively serves as a drain electrode and a source electrode. The second electrode 63, the active layer 30a, and the third electrode 62 are sequentially laminated on the substrate 10.

Furthermore, a thickness of the third electrode 62 is greater than a thickness of the active layer 30a. As a preferred embodiment, the difference between the thickness of the third electrode 62 and the thickness of the active layer 30a is greater than or equal to 500 Å, which realizes an effective control of the active layer 30a by the first electrode 61, and realizing a vertical TFT switch function.

Figure 2N:
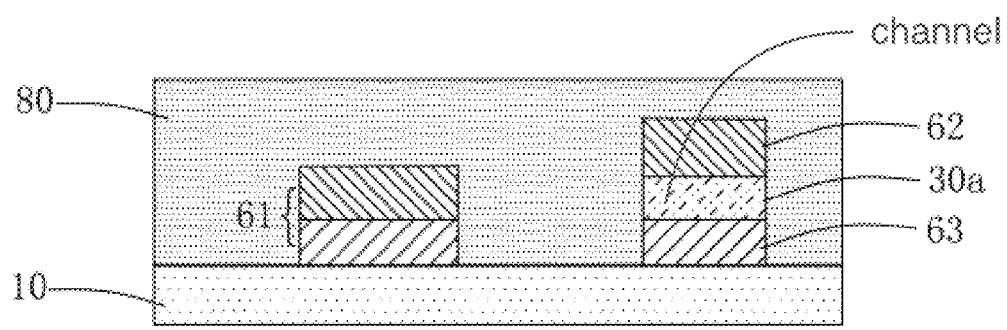

Step 4: referring to FIG. 2N, forming an insulation layer 80 on the first electrode 61, the third electrode 62 and the substrate 10. The material of the insulation layer 80 is preferably silicon nitride.

The manufacturing method for thin-film transistor disclosed in the present invention can complete the fabrication of the first electrode, the second electrode, the third electrode and the semiconductor active layer by two photolithography processes, thereby reducing the number of process steps and reducing the cost.

Second Embodiment

As shown in FIG. 2N, the thin-film transistor according to the second embodiment of the present invention includes a first electrode 61 and a second electrode 63 disposed on the substrate 10, and a semiconductor active layer 30a disposed on the second electrode 63, a third electrode 62 disposed on the semiconductor active layer 30a and an insulation layer 80 covering the first electrode 61, the second electrode 63, the semiconductor active layer 30a, and the third electrode 62. The first electrode 61 and the second electrode 63 are disposed at an interval. The first electrode 61 is formed by a first metal layer 20 and a second metal layer 60. The second electrode 63 is formed by the first metal layer 20, and the third electrode 62 is formed by the second metal layer 60, and projections of the second electrode 63 and the third electrode 62 on a horizontal plane are overlapped.

Furthermore, a thickness of the first electrode 61 is greater than a thickness of the active layer 30a. As a preferred embodiment, the difference between the thickness of the first electrode 61 and the thickness of the active layer 30a is greater than or equal to 500 Å, which realizes an effective control of the active layer 30a by the gate electrode 61 and realizing a vertical TFT switch function.

The detailed description of the embodiments of the present invention has been described above, although some embodiments have been shown and described. However, those skilled in the art should understand that without departing from the spirit and scope of the invention as defined by the claims and their equivalents, these embodiments may be modified and improved, and such modifications and improvements are also within the scope of the present invention.

What is claimed is:

1. A manufacturing method for thin-film transistor, comprising steps of:
    step 1: depositing a first metal layer on a substrate;
    step 2: depositing a semiconductor material layer on the first metal layer, and using a first photolithography process to perform a patterning process to the semiconductor material layer in order to form a semiconductor active layer;
    step 3: depositing a second metal layer on the first metal layer and the semiconductor active layer, and using a second photolithography process to perform a patterning process to the first metal layer and the second metal layer in order to obtain a first electrode, a second electrode, and a third electrode, wherein the first electrode and the second electrode are disposed at an interval, the first electrode is disposed on the substrate, the second electrode is disposed between the substrate and the semiconductor active layer, and the third electrode is disposed on the semiconductor active layer, projections of the second electrode and the third electrode on a horizontal plane are overlapped; the first electrode is formed by the first metal layer and the second metal layer;
    wherein the second electrode is disposed on and in direct contact with a lower surface of the semiconductor active layer and the third electrode is disposed on and in direct contact with an upper surface of the semiconductor active layer.

2. The manufacturing method for thin-film transistor according to claim 1, wherein after the step 3, the method further comprises a step of:
    forming an insulation layer on the first electrode, the third electrode and the substrate.

3. The manufacturing method for thin-film transistor according to claim 1, wherein the first electrode is formed by the first metal layer and the second metal layer.

4. The manufacturing method for thin-film transistor according to claim 1, wherein the step of depositing a semiconductor material layer on the first metal layer, and using a first photolithography process to perform a patterning process to the semiconductor material layer in order to form a semiconductor active layer comprises steps of:
    depositing the semiconductor material layer on the first metal layer;
    depositing a first photoresist layer on the semiconductor material layer;
    using a first mask to expose the first photoresist layer, and then developing to obtain a first photoresist block;
    etching the semiconductor material layer not covered by the first photoresist block to obtain the semiconductor active layer; and
    stripping the first photoresist block.

5. The manufacturing method for thin-film transistor according to claim 1, wherein the step of depositing a second metal layer on the first metal layer and the semiconductor active layer, and using a second photolithography process to perform a patterning process to the first metal layer and the second metal layer in order to obtain a first electrode, a second electrode, and a third electrode comprises steps of:

depositing a second metal layer on the first metal layer and the active layer;

depositing a second photoresist material layer on the second metal layer;

using a second mask to expose the second photoresist material layer, and then developing to obtain a second photoresist block and a third photoresist block which are disposed at an interval;

etching the first metal layer and the second metal layer to obtain the first electrode, the second electrode, and the third electrode; and stripping the second photoresist block and the third photoresist block.

6. The manufacturing method for thin-film transistor according to claim 1, wherein the first electrode is a gate electrode, the second electrode and the third electrode are source electrode and drain electrode, wherein the gate electrode is formed of a portion of the first metal layer and a portion of the second metal layer that are separated from a remaining portion of the first metal layer and a remaining portion of the second metal layer that form the second electrode and the third electrode.

7. The manufacturing method for thin-film transistor according to claim 1, wherein a thickness of the third electrode is greater than a thickness of the semiconductor active layer.

8. The manufacturing method for thin-film transistor according to claim 7, wherein a difference between the thickness of the third electrode and the thickness of the active layer is greater than or equal to 500 Å.

9. A thin-film transistor, wherein thin-film transistor comprises:

a first electrode and a second electrode disposed on the substrate;

a semiconductor active layer disposed on the second electrode;

a third electrode disposed on the semiconductor active layer; and an insulation layer covering the first electrode, the second electrode, the semiconductor active layer, and the third electrode;

wherein the first electrode and the second electrode are disposed at an interval, the first electrode is formed by a first metal layer and a second metal layer, the second electrode is formed by the first metal layer, the third electrode is formed by the second metal layer, and projections of the second electrode and the third electrode on a horizontal plane are overlapped; and wherein the second electrode is disposed on and in direct contact with a lower surface of the semiconductor active layer and the third electrode is disposed on and in direct contact with an upper surface of the semiconductor active layer.

10. The thin-film transistor according to claim 9, wherein the first electrode is a gate electrode, the second electrode and the third electrode are source electrode and drain electrode, wherein the gate electrode is formed of a portion of the first metal layer and a portion of the second metal layer that are separated from a remaining portion of the first metal layer and a remaining portion of the second metal layer that form the second electrode and the third electrode.

11. The thin-film transistor according to claim 9, wherein a thickness of the third electrode is greater than a thickness of the semiconductor active layer.

12. The thin-film transistor according to claim 9, wherein a difference between the thickness of the third electrode and the thickness of the active layer is greater than or equal to 500 Å.

* * * * *